United States Patent
Kanaya

(10) Patent No.: US 8,080,841 B2
(45) Date of Patent: Dec. 20, 2011

(54) SEMICONDUCTOR DEVICE HAVING A FERROELECTRIC CAPACITOR AND METHOD OF MANUFACTURING THE SAME

(75) Inventor: Hiroyuki Kanaya, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 12/553,763

(22) Filed: Sep. 3, 2009

(65) Prior Publication Data

US 2010/0052023 A1 Mar. 4, 2010

(30) Foreign Application Priority Data

Sep. 3, 2008 (JP) ................................ 2008-226415

(51) Int. Cl.
*H01L 29/76* (2006.01)
(52) U.S. Cl. ............................... 257/295; 257/E27.104
(58) Field of Classification Search .................. 257/295, 257/E27.104
See application file for complete search history.

(56) References Cited

U.S. PATENT DOCUMENTS 6,756,262 B1 * 6/2004 Nakamura et al. ............ 438/240

FOREIGN PATENT DOCUMENTS

JP 2002-289797 10/2002
* cited by examiner

*Primary Examiner* — Thanh V Pham
(74) *Attorney, Agent, or Firm* — Oblon, Spivak, McClelland, Maier & Neustadt, L.L.P.

(57) ABSTRACT

A semiconductor device includes a semiconductor substrate, a plurality of transistors connected in series and including a transistor having first and second diffusion regions arranged in the semiconductor substrate. The device also includes an insulating film columnar body arranged above the semiconductor substrate, and having a side which is inclined to a top surface of the substrate by an inclination angle greater than 0 degrees and less than 90 degrees. The device includes a memory cell including a first electrode arranged on the side of the insulating film columnar body and connected to the first diffusion region via a first contact plug, a ferroelectric film arranged on the first electrode, and a second electrode arranged on the ferroelectric film, and connected to the second diffusion region via a second contact plug.

10 Claims, 13 Drawing Sheets

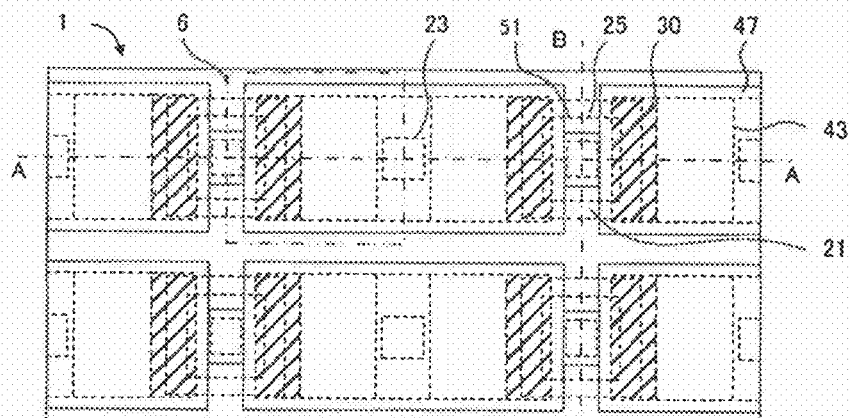
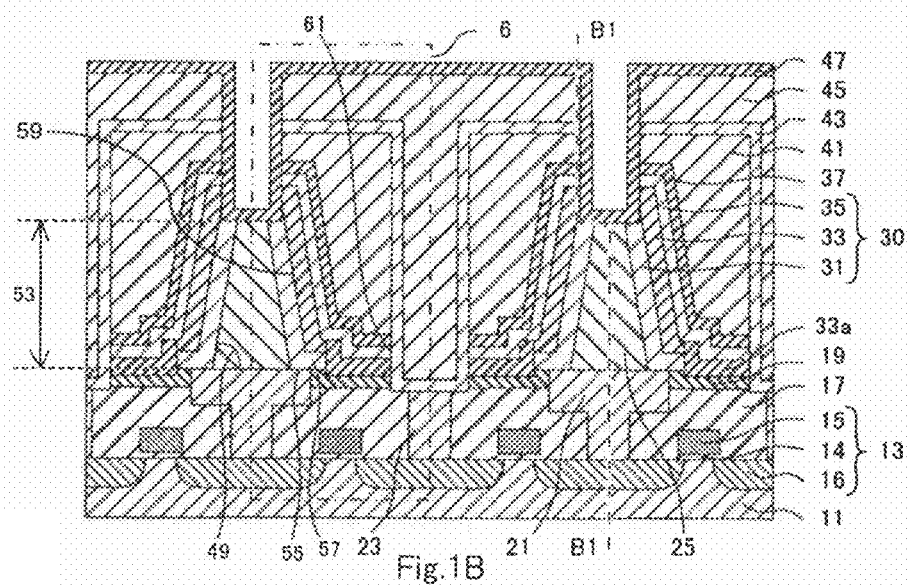
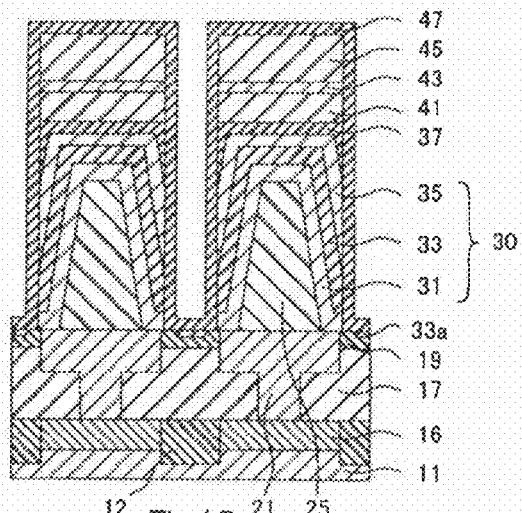

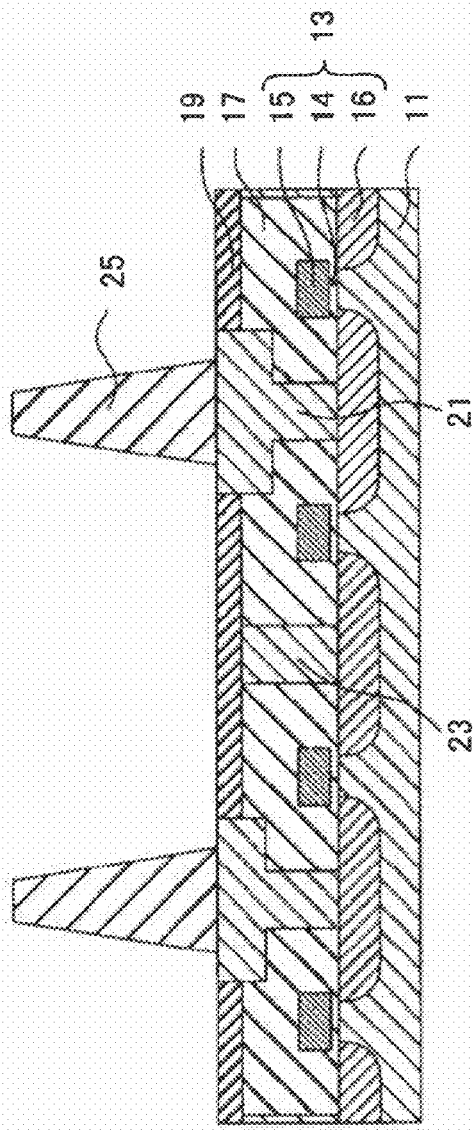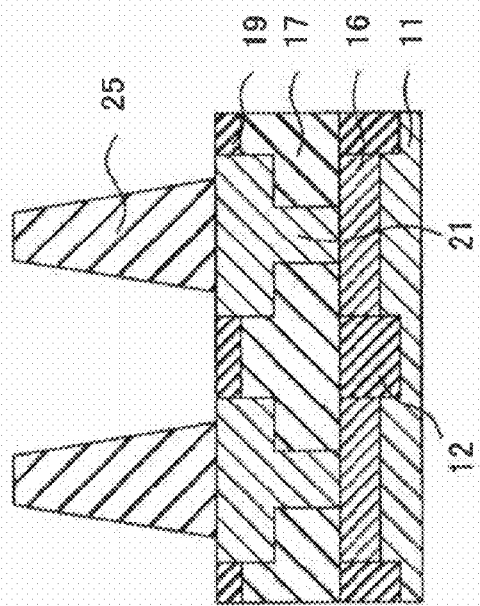
Fig. 3A
Fig. 3B

US 8,080,841 B2

SEMICONDUCTOR DEVICE HAVING A FERROELECTRIC CAPACITOR AND METHOD OF MANUFACTURING THE SAME

CROSS-REFERENCE TO A RELATED APPLICATION

This application is based upon and claims the benefit of priority from the prior Japanese Patent Application No. 2008-226415, filed Sep. 3, 2008, the entire contents of which are incorporated herein by reference.

BACKGROUND OF THE INVENTION

1. Field of the Invention

The present invention relates to a semiconductor device having a ferroelectric capacitor, and to a method of manufacturing the semiconductor device.

2. Description of the Related Art

A semiconductor device storing data in a nonvolatile manner using a ferroelectric capacitor has been conventionally known (such a semiconductor device is also called a ferroelectric random access memory (FeRAM) below). Among FeRAMs, a chain FeRAM is configured of cell array blocks each formed by serially connecting multiple pairs of parallel-connected transistors and ferroelectric capacitors. The ferroelectric capacitor is formed, for example, by vertically stacking a lower electrode, a ferroelectric film, and an upper electrode on a semiconductor substrate covered with an insulating film.

When the electrodes and ferroelectric film are vertically stacked, the electrode on either side of the ferroelectric film extends horizontally. Such a horizontal ferroelectric capacitor has a problem that, when size reduction is to be achieved, a sufficiently large area cannot be secured for the capacitor, thereby reducing the amount of signal. To address this problem, a semiconductor device having a ferroelectric capacitor having electrodes vertically extending on both sides of a ferroelectric film has been disclosed. To obtain such a ferroelectric capacitor, for example, after formation of a capacitor electrode film, a groove-like opening part is formed by etch-removing the capacitor electrode film vertically to the film surface, and a ferroelectric film is embedded in that vertical opening part.

In the semiconductor device disclosed, the left and right electrodes are processed by dry etching (reactive dry etching (RIE)) in order to embed the ferroelectric film between the electrodes. As a result, the electrodes suffer heavy damage on interfaces with the ferroelectric film, leading to a problem of deterioration of the capacitor characteristics.

SUMMARY OF THE INVENTION

An aspect of the present invention provides a novel semiconductor device including: a semiconductor substrate; a plurality of transistors connected in series, a first transistor in the plurality of transistors having a first diffusion region and a second diffusion region arranged in the semiconductor substrate; an insulating film columnar body arranged above the semiconductor substrate and having a first side which is inclined to a top surface of the substrate by a first inclination angle that is greater than 0 degrees and less than 90 degrees; and a first memory cell including a first electrode arranged on the first side of the insulating film columnar body and connected to the first diffusion region via a first contact plug, a first ferroelectric film arranged on the first electrode and inclined to the top surface of the substrate by the first inclination angle, and a second electrode arranged on the first ferroelectric film, connected to the second diffusion region via a second contact plug, and inclined to the top surface of the substrate by the first inclination angle.

Another aspect of the present invention provides a method of manufacturing a semiconductor device, the method including: forming a plurality of transistors connected in series, a first transistor in the plurality of transistors having a first diffusion region and a second diffusion region in a semiconductor substrate; forming a first insulating film on the semiconductor substrate so that the first insulating film covers the first transistor; forming a first contact plug connected to the first diffusion region and a second contact plug connected to the second diffusion region; forming an insulating film columnar body above the semiconductor substrate, and the insulating film columnar body having a first side which is inclined to a top surface of the substrate by a first inclination angle greater than 0 degrees and less than 90 degrees; forming a first electrode film connected to the first contact plugs, so that the first electrode film covers the insulating film columnar body; removing a portion of the first electrode film on the first insulating film; forming a ferroelectric film to cover the first electrode film; forming a second electrode film to cover the ferroelectric film and connect to the second contact plug; forming a second insulating film to cover the second electrode film; forming a first groove in a transistor connection direction between the insulating film columnar bodies and between transistors connected in series so that an upper surface of the second contact plug is exposed; forming a conducting film to cover the second insulating film and a surface of the first groove so that the second electrode film connects to the second contact plugs; forming a third insulating film to cover the conducting film; forming a second groove and a third groove so that the first electrode, the ferroelectric film and the second electrode film are cut between the insulating film columnar bodies and on an upper surface of the insulating film columnar bodies; and forming a fourth insulating film on a surface of the second groove, a surface of the third groove, and a surface of the third insulating film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a plan view showing the structure of a semiconductor device according to Embodiment 1 of the present invention;

FIG. 1B is a cross-sectional view taken along the A-A line in FIG. 1A;

FIG. 1C is a cross-sectional view taken almost along the B-B line, perpendicular to the A-A line, in FIG. 1A;

FIG. 3A is a cross-sectional view taken at a position almost corresponding to FIG. 1B showing a method of manufacturing the semiconductor device according to Embodiment 1 of the present invention;

FIG. 3B is a cross-sectional view taken at a position almost corresponding to FIG. 1C;

DESCRIPTION OF THE PREFERRED EMBODIMENTS

Figure 2:
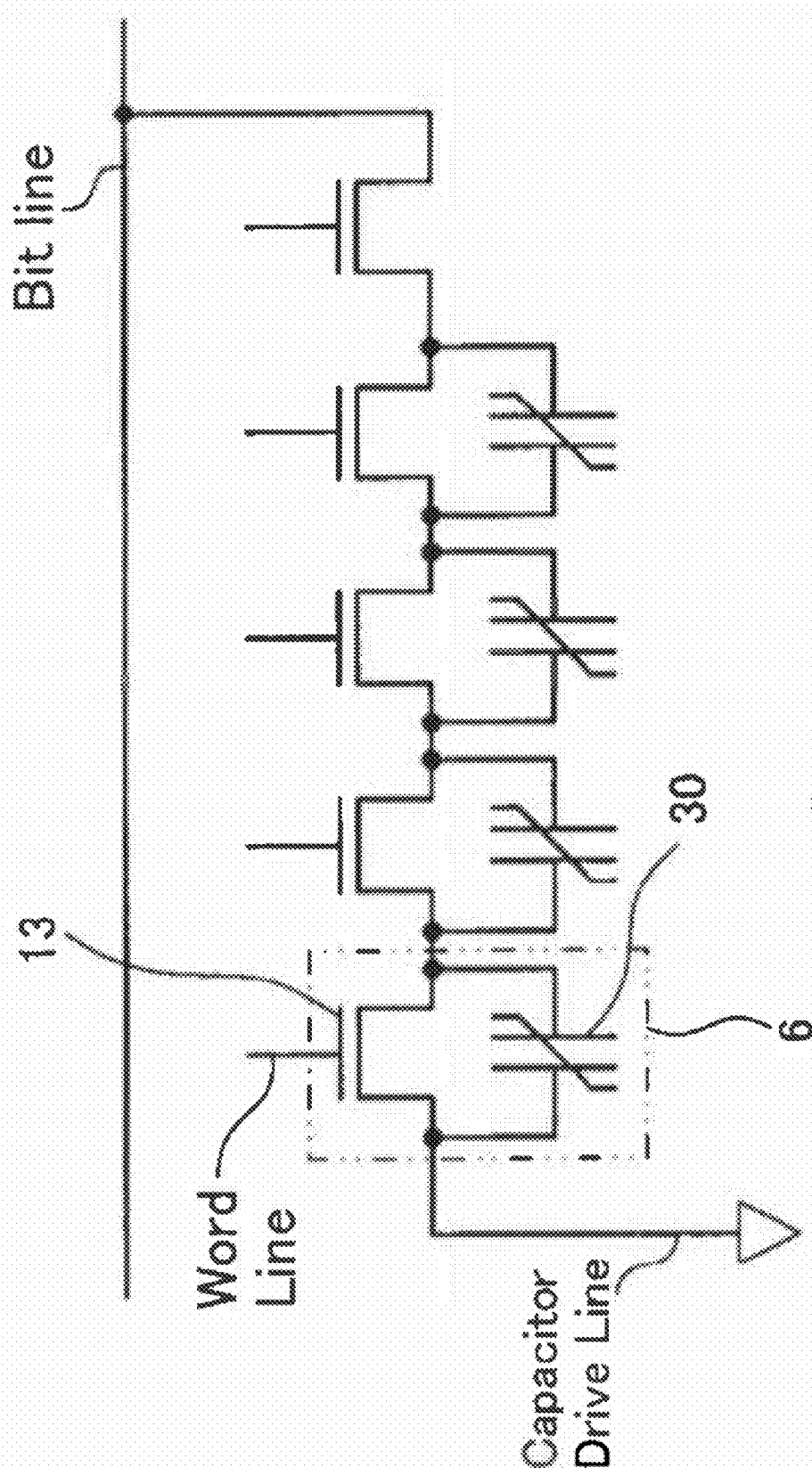
FIG. 2 is a schematic view showing the circuit configuration of the semiconductor device according to Embodiment 1 of the present invention.

Various other objects, features and attendant advantages of the present invention will be more fully appreciated from the following detailed description when considered in connection with the accompanying drawings in which like reference characters designate like or corresponding parts throughout the several views.

With reference to the drawings, embodiments of the present invention will be described below. Throughout the drawings, the same components bear the same reference numerals.

Embodiment 1

With reference to FIGS. 1 to 11, descriptions are given below of a semiconductor device and a method of manufacturing the semiconductor device, according to Embodiment 1 of the present invention.

As shown in FIGS. 1A-1C, a semiconductor device 1 has memory cells 6. Each of the memory cells 6 includes a transistor 13 formed on a semiconductor substrate 11 and a ferroelectric capacitor 30 above the transistor 13 (farther from the semiconductor substrate 11 than the transistor 13). The ferroelectric capacitor 30 is formed on a side face of an insulating film columnar body 25 which is inclined to the semiconductor substrate 11 by an inclination angle 49 greater than 0° and less than 90° and preferably 75° to 86°. The ferroelectric capacitor 30 has the almost same degree of inclination as the side face of the insulating film columnar body 25.

To be more specific, in each memory cell 6, the semiconductor device 1 includes the semiconductor substrate 11, the transistor 13, a lower electrode 31 being a first electrode, a ferroelectric film 33, and an upper electrode 35 being a second electrode. The transistor 13 has paired diffusion layers 16 serving as a source and a drain, respectively, and being formed in the semiconductor substrate and separated from each other. The lower electrode 31 is formed on one of the side faces of the insulating film columnar body 25. The side face of the insulating film columnar body 25 is inclined to the surface of the substrate 11 by an inclination angle 49 greater than 0° and less than 90° and preferably 75° to 86°. The insulating film columnar body 25 has a bottom face almost parallel to the surface of the semiconductor substrate 11, and a width of the insulating film columnar body 25 is reduced and tapers off at increasing distances away from the semiconductor substrate. The lower electrode 31 is electrically connected to one of the diffusion layers 16 via a contact plug 21 being a first contact plug. The ferroelectric film 33 is formed on a surface of the lower electrode 31 that is opposite to a surface where the insulating film columnar body 25 is formed, and has an inclination similar to that of the side face of the insulating film columnar body 25. The upper electrode 35 is formed on a surface of the ferroelectric film 33 that is opposite to a surface where the lower electrode 31 is formed, and has an inclination similar to that of the side face of the insulating film columnar body 25. The upper electrode 35 is connected to the other one of the diffusion layers 16 via a contact plug 23 being a second contact plug.

The semiconductor device 1 is referred to as a TC parallel unit serial connection type ferroelectric memory. As shown in FIG. 2, multiple switching transistors (T) 13 are serially connected, and a ferroelectric capacitor (C) 30 is parallel-connected to each of the transistors 13. One memory cell 6 includes one transistor 13 and one ferroelectric capacitor 30. The direction in which the transistors 13 are serially connected corresponds to the direction of the A-A line in FIG. 1A.

As shown in FIGS. 1A-1C, the semiconductor substrate 11 is, for example, a silicon substrate having a p-type device formation region. The n-type diffusion layers 16 are formed in the device formation region in the surface of the semiconductor substrate 11 in such a manner as to be separated from each other. A gate electrode 15 is formed above a part where the paired diffusion layers 16 are separated from each other, with a gate insulating film 14 interposed therebetween. Each of the transistors 13 is thus formed.

The transistors 13 are covered with, for example, an interlayer insulating film 17 formed of a silicon oxide film. A protective insulating film 19 formed of an aluminum oxide film, for example, is formed on the interlayer insulating film 17.

The contact plug 21 is formed of any one of, for example, TiN, TiAlxNy (x=1-99, y=99-1), and Ti/TiN/W. The contact plug 21 has a rectangular plate shape having a top face almost flush with the top face of the protective insulating film 19. The contact plug 21 has a column extending almost vertically from the center of the rectangular plate toward one of the diffusion layers 16. The column has a cross section smaller than the upper part of the rectangle. As shown in FIGS. 1B and 1C, the contact plug 21 has a T shape in cross section.

The insulating film columnar body 25 has a prismoid shape, or a shape close to a prismoid. The insulating film columnar body 25 is formed of, for example, a silicon oxide film, and its bottom face is rectangular having edges in the A-A line direction and edges in the B-B line direction, all of which have almost equal lengths. The top face of the insulating film columnar body 25 is almost parallel to the bottom face, and has edges almost parallel to those of the bottom face. The top face has a shape similar to, or close to, that of the bottom face, and is within the bottom face in a plan view. Each of the four side faces of the insulating film columnar body 25 is inclined to the bottom face by an inclination angle 49 of greater than 0° and less than 90° and preferably about 75° to 86°. In the insulating film columnar body 25, a length 51 of one edge of the bottom face is, for example, about 90 nm, and a height 53 in a direction vertical to the bottom face is, for example, about 500 nm. Note that the insulating film columnar bodies 25 do not necessarily have to be independent prismoids, but can be, for example, like a chain of mountains in which the bottom faces and top faces of the insulating film columnar body 25 are continuous in the B-B line direction.

The center of the bottom face of the insulating film columnar body 25 almost coincides with the center of the top face of the contact plug 21, and the bottom face of the insulating film columnar body 25 is entirely within the top face of the contact plug 21 in a plan view (i.e., each of the dimensions of the bottom face of the insulating film columnar body 25 are smaller than the dimensions of the top face of the contact plug 21). Accordingly, a peripheral part 55 of the top face of the contact plug 21 is not in contact with the bottom face of the insulating film columnar body 25, and the periphery part 55 of the top face of the contact plug 21 is in contact with the lower electrode 31.

The ferroelectric capacitor 30 has a structure in which the lower electrode 31, the ferroelectric film 33, and the upper electrode 35 are sequentially arranged on the insulating film columnar body 25.

The lower electrode 31 is formed of, for example, Ti or Ir formed on Ti, and is arranged on the inclined side face of the insulating film columnar body 25. The lower electrode 31 includes a horizontal part 57 arranged to contact almost horizontally with the top face of the contact plug 21. The lower electrode 31 is electrically connected to the contact plug 21.

The ferroelectric film 33 is formed of, for example, PZT (Pb $(Zr_xTi_{1-x})O_3$), and is arranged on the inclined side face 59 of the lower electrode 31 and the horizontal part 57 of the lower electrode 31. A ferroelectric film 33a has a PZT composition and is in contact with the ferroelectric film 33. The ferroelectric film 33a covers an end of the horizontal part 57 of the lower electrode 31, and extends almost horizontally.

The upper electrode 35 is formed of, for example, SRO ($SrRuO_3$) or $IrO_2$ formed on SRO, and is formed in such a manner as to cover the ferroelectric film 33 and the ferroelectric film 33a. A horizontal end part 61 of the upper electrode 35 is electrically connected to a conducting film 43 extending almost vertically. The conducting film 43 is formed of, for example, TiN, and is electrically connected to the contact plug 23.

The upper electrode 35 is covered with a protective insulating film 37, which is in turn covered with an interlayer insulating film 41. The conducting film 43 is formed on the interlayer insulating film 41, and the conducting film 43 is covered with an interlayer insulating film 45. Note that the conducting film 43 penetrates the interlayer insulating film 41 above the contact plug 23, and is thereby connected to the contact plug 23. The interlayer insulating film 45 is covered with a protective insulating film 47.

One memory cell 6, which is a unit of memory, is configured with one ferroelectric capacitor 30 and one transistor 13 being connected to the ferroelectric capacitor 30 and having a switching function. Two ferroelectric capacitors 30 are formed on respective opposing sides of one insulating film columnar body 25 in a back-to-back manner. Each adjacent pair of memory cells 6 includes a different ferroelectric capacitor 30, the adjacent memory cells 6 share a same insulating film columnar body 25, and the adjacent memory cells 6 are symmetrical to each other with respect to a vertical center line passing through a center of the insulating film columnar body 25 in a direction perpendicular to the top surface of the substrate. The ferroelectric capacitor 30 is covered with one or more of the protective insulating films 37, 47, and the conducting film 43.

Next, a description will be given of a method of manufacturing the semiconductor device 1. As shown in FIGS. 3A and 3B, the transistors 13 each have the paired diffusion layers 16 in the semiconductor substrate 11 and are serially connected while sharing the diffusion layers 16. These transistors 13 are formed by a known method. The interlayer insulating film 17 is formed to cover the transistors 13. Contact holes are formed in the interlayer insulating film 17, and the contact plugs 23 are embedded into these contact holes. The contact plugs 23 are formed of, for example, any one of TiN, TiAlxNy (x=1-99, y=99-1), and Ti/TiN/W.

After that, surfaces of the interlayer insulating film 17 and the contact plugs 23 are planarized by a chemical mechanical polishing (CMP) method or the like. Then, the protective insulating film 19 is formed with an aluminum oxide film or the like. The protective insulating film 19 plays a role of preventing diffusion of Pb in a PZT film, and a role of a RIE stopper. A material other than the aluminum oxide film (e.g., $Al_2O_3$) can be used as the protective insulating film 19 and as other protective insulating films to be described later. For example, SiAlxOy (e.g., SiAlO), ZrOx (e.g., $ZrO_2$), SixNy (e.g., $Si_3N_4$), TiAlxNy (e.g., $TiAl_{0.3}N_{0.7}$), or the like, or a combination of these can be used. The interlayer insulating film 17 and the protective insulating film 19 correspond to a first insulating film.

Contact holes having a relatively small diameter (or a side edge) and reaching one of each pair of the diffusion layers 16 are first formed in the protective insulating film 19 and the interlayer insulating film 17. Next, relatively large contact holes are formed with the centers of which aligning with the centers of the contact holes formed earlier. Here, the relatively large contact holes are formed so that their bottom faces may be in the interlayer insulating film 17. Then, the contact plugs 21 formed of the same material as the contact plugs 23 are embedded in these contact holes. Surfaces of the protective insulating film 19 and the contact plugs 21 are then planarized by the CMP method or the like.

A silicon oxide film or the like is deposited on the surfaces of the protective insulating film 19 and the contact plugs 21 by a plasma CVD method or the like, and is then patterned by using photolithography processes. Etching is then performed by an RIE method. Thereby, as shown in FIGS. 3A and 3B, the insulating film columnar bodies 25 are formed. Each of the insulating film columnar bodies 25 is a prismoid shape, or a shape close to a prismoid, having a rectangular bottom face and a height of about 500 nm. The side faces of the insulating film columnar body 25 are inclined to the bottom face by an inclination angle 49 of greater than 0° and less than 90° and preferably about 75° to 86°. A positional relationship between each contact plug 21 and its corresponding insulating film columnar body 25 is as described earlier.

Figure 4A:
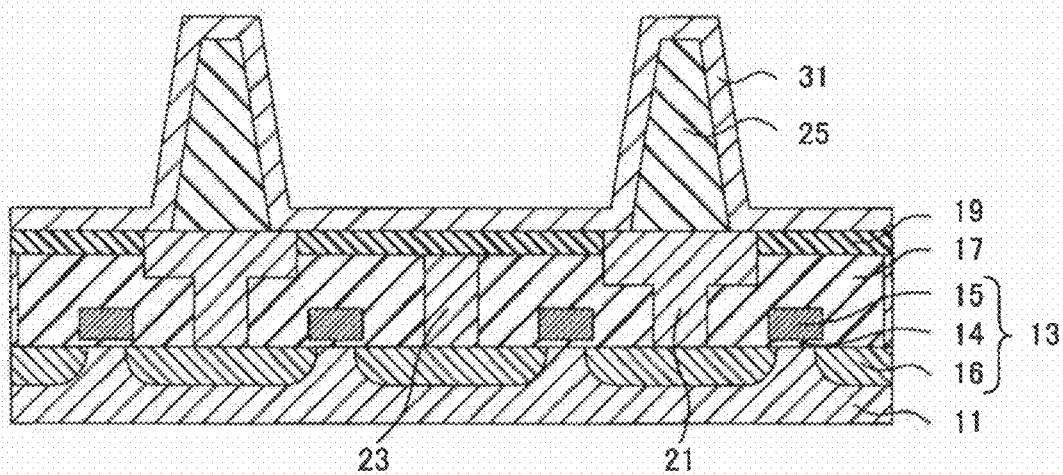
FIG. 4A is a cross-sectional view showing the method of manufacturing the semiconductor device according to Embodiment 1 of the present invention.
Figure 4B:
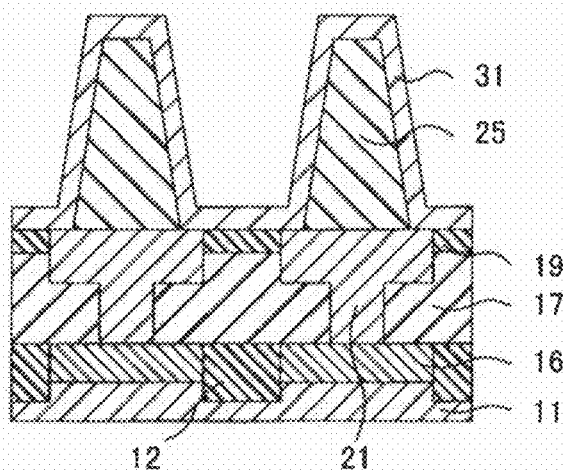
FIG. 4B is a cross-sectional view showing the method of manufacturing the semiconductor device according to Embodiment 1 of the present invention.

As shown in FIGS. 4A and 4B, the lower electrode 31 formed of Ir is deposited to a thickness of, for example, about 50 nm on the contact plugs 21, the insulating film columnar bodies 25, the protective insulating film 19, and the like by using a CVD method or a sputtering method. In addition, adhesion can be improved by depositing a Ti film (about 3 nm), a TixAly film (about 3 nm), a TiAlxNy film (about 3 nm), or the like, prior to the Ir deposition. Peripheral parts 55 of the contact plugs 21 are in contact, and thus electrically connected, with the lower electrode 31. Like the upper electrode 35, the lower electrode 31 is expressed by the same name before and after being processed.

Figure 5A:
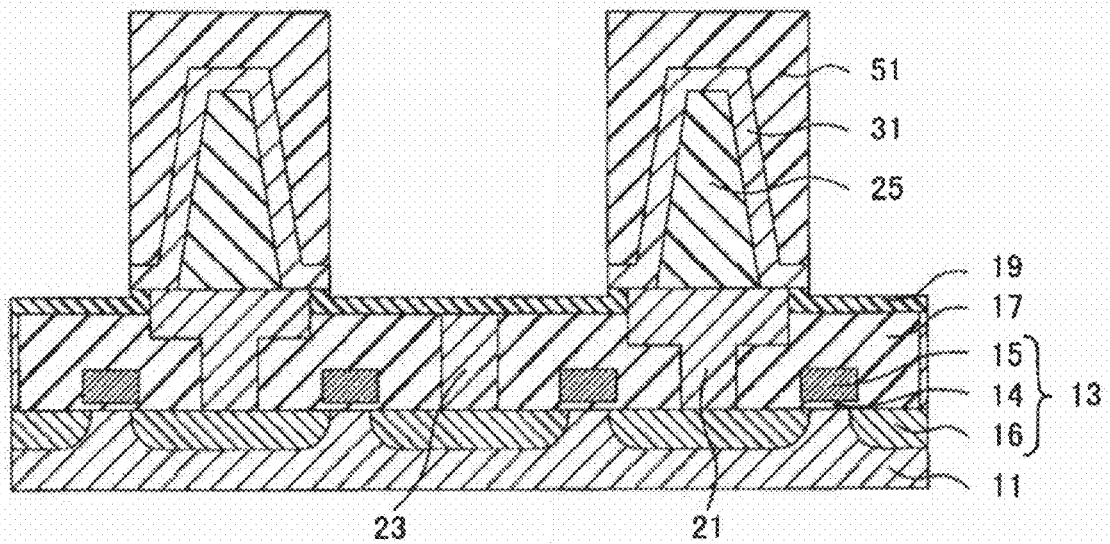
FIG. 5A is a cross-sectional view showing the method of manufacturing the semiconductor device according to Embodiment 1 of the present invention.
Figure 5B:
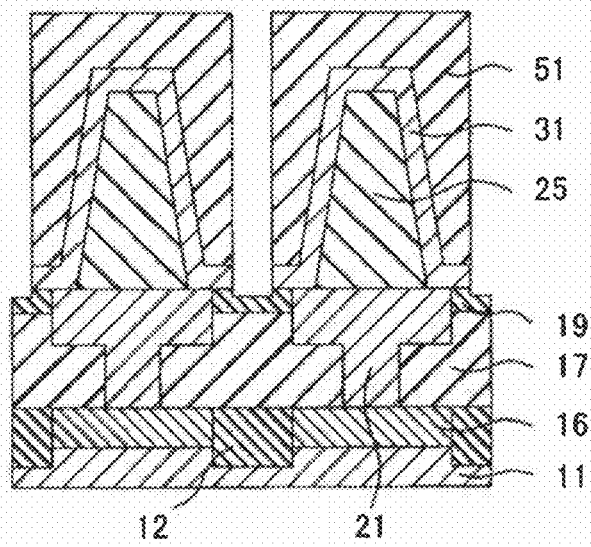
FIG. 5B is a cross-sectional view showing the method of manufacturing the semiconductor device according to Embodiment 1 of the present invention.

As shown in FIGS. 5A and 5B, an oxide film mask 51 formed of a silicon oxide film is deposited on the lower electrode 31. After that, the oxide film mask 51 is planarized by the CMP method or the like, and is then patterned by using the photolithography processes. Using the patterned oxide film mask 51 as a mask, Ir is etched by, for example, a high temperature RIE method with 300° C. or more. As a result, the lower electrode 31 is formed on the top faces and side faces of the insulating film columnar bodies 25, peripheral parts 55 of the contact plugs 21, and parts of the protective insulating film 19 adjoining the contact plugs 21.

Thereafter, the oxide film mask 51 is removed by the RIE method. RIE conditions for etching the oxide film mask 51 have a high selection ratio against Ir. In other words, it is very unlikely that the surface of Ir is etch-removed by the RIE. Accordingly, etching damage on the surface of Ir can be prevented. To further lower the Ir surface damage, it is preferable to perform rapid thermal annealing (RTA) under, for example, 500° C. to 650° C. in nitrogen atmosphere.

Figure 6A:
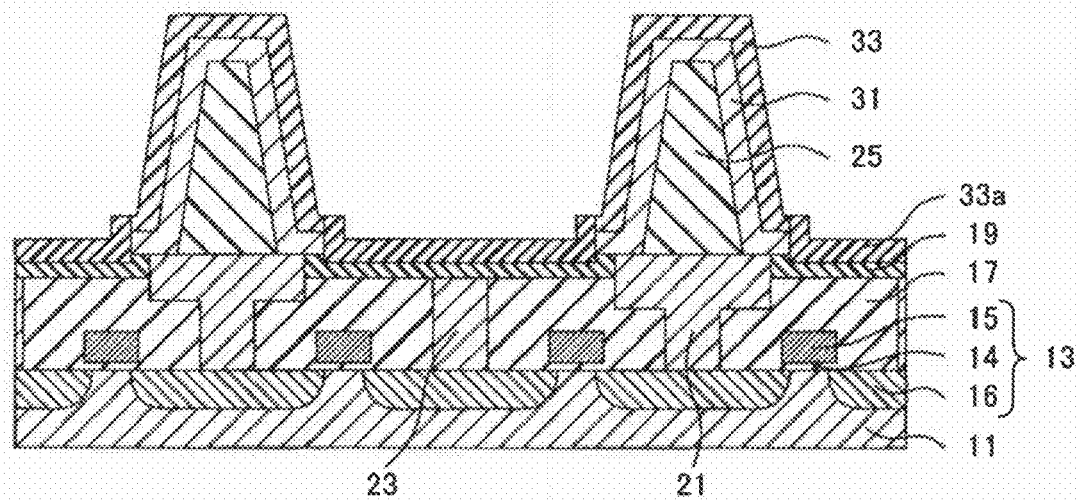
FIG. 6A is a cross-sectional view showing the method of manufacturing the semiconductor device according to Embodiment 1 of the present invention.
Figure 6B:
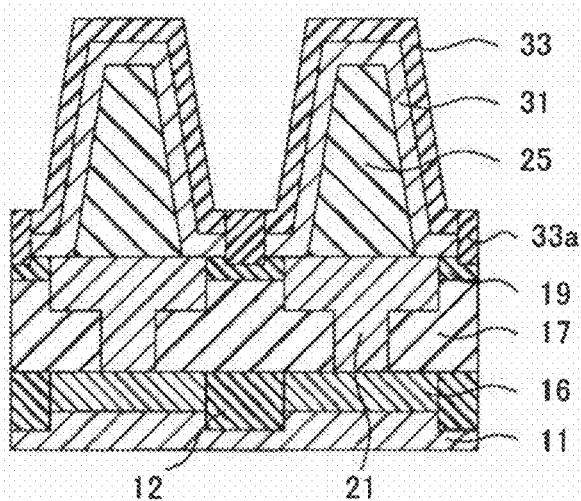
FIG. 6B is a cross-sectional view showing the method of manufacturing the semiconductor device according to Embodiment 1 of the present invention.

As shown in FIGS. 6A and 6B, the ferroelectric film 33 and the ferroelectric film 33a both formed of PZT are deposited to a thickness of, for example, 50 nm on the lower electrode 31 and the protective insulating film 19, by using a CVD method or a sputtering method. The PZT film is deposited at a temperature, for example, equal to or higher than the Curie point. A film on the lower electrode 31 becomes the ferroelectric film 33 through desired crystallization, whereas a film on the protective insulating film 19 becomes the ferroelectric film 33a having different properties from the ferroelectric film 33. Note that the PZT film can be subjected to heat processing after deposition.

Figure 7A:
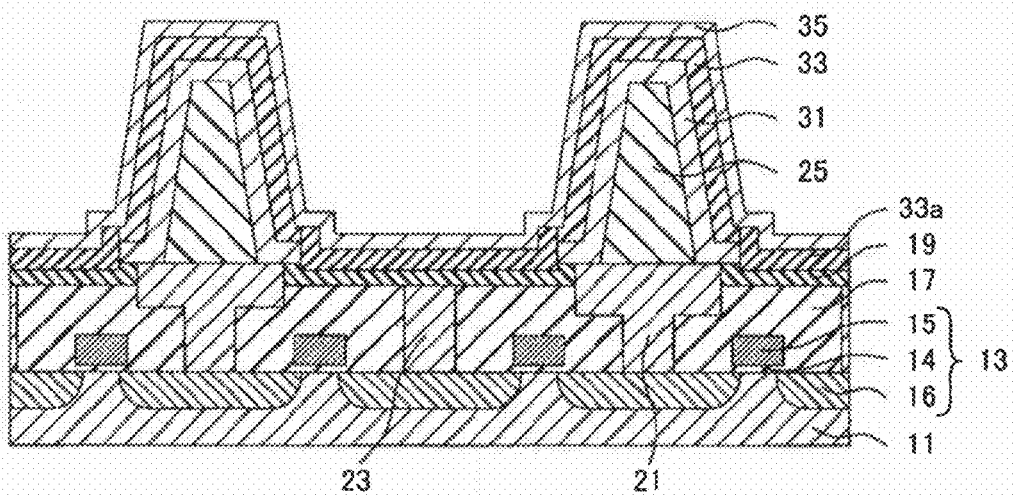
FIG. 7A is a cross-sectional view showing the method of manufacturing the semiconductor device according to Embodiment 1 of the present invention.
Figure 7B:
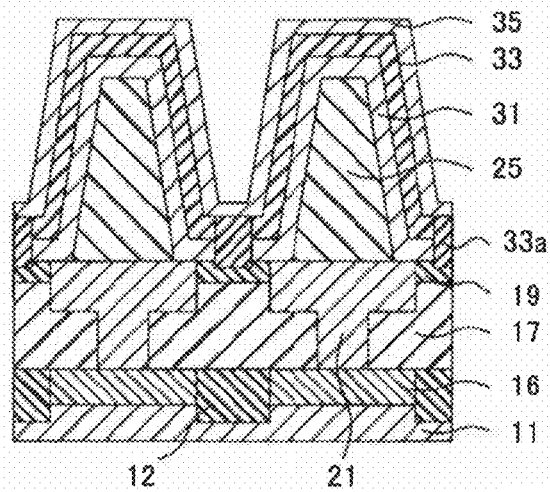
FIG. 7B is a cross-sectional view showing the method of manufacturing the semiconductor device according to Embodiment 1 of the present invention.

As shown in FIGS. 7A and 7B, the upper electrode 35 formed of SRO (about 10 nm)/IrO$_2$ (about 20 nm) is deposited on the ferroelectric film 33 and the ferroelectric film 33a, by using the CVD method or the sputtering method. The upper electrode 35 can also be formed of SRO (about 10 nm)/Ir (about 20 nm). The ferroelectric film 33 and the upper electrode 35 can be deposited serially in the same device.

Figure 8A:
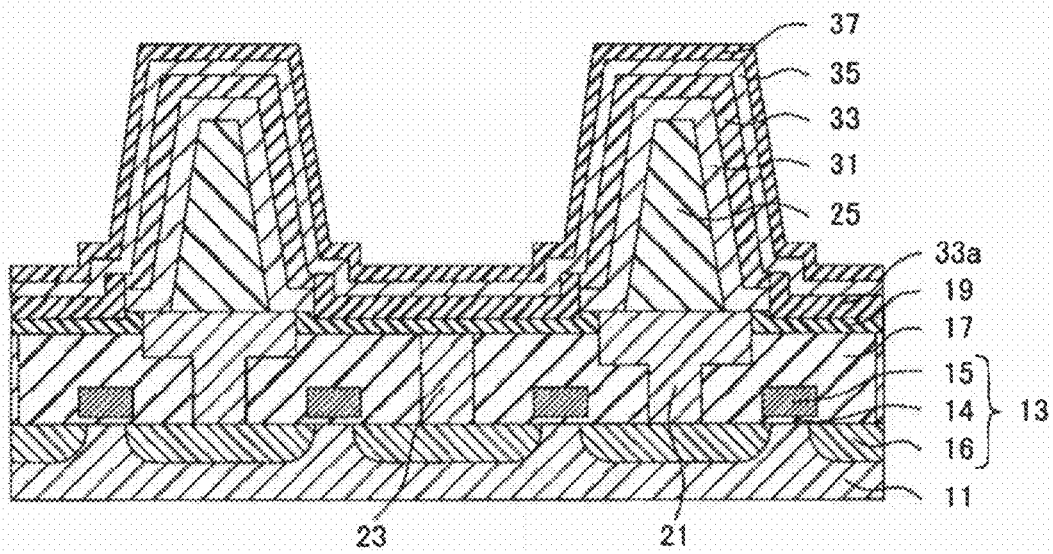
FIG. 8A is a cross-sectional view showing the method of manufacturing the semiconductor device according to Embodiment 1 of the present invention.
Figure 8B:
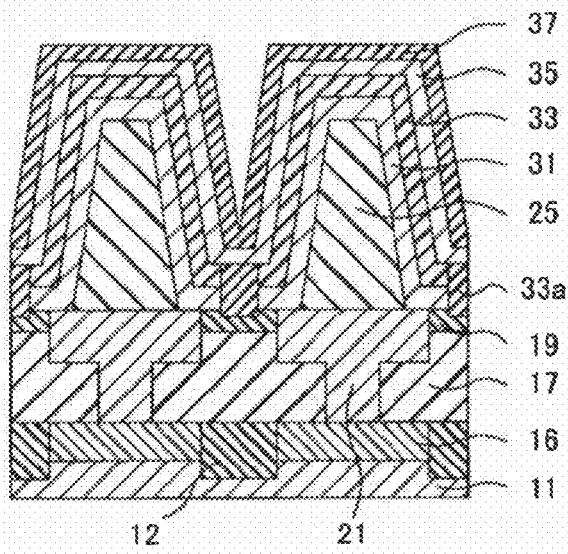
FIG. 8B is a cross-sectional view showing the method of manufacturing the semiconductor device according to Embodiment 1 of the present invention.

As shown in FIGS. 8A and 8B, the protective insulating film 37 formed of an aluminum oxide film or the like is deposited on the upper electrode 35 by the sputtering method or an atomic layer deposition (ALD) method. The protective insulating film 37 and the interlayer insulating film 41 to be formed next correspond to a second insulating film.

Figure 9A:
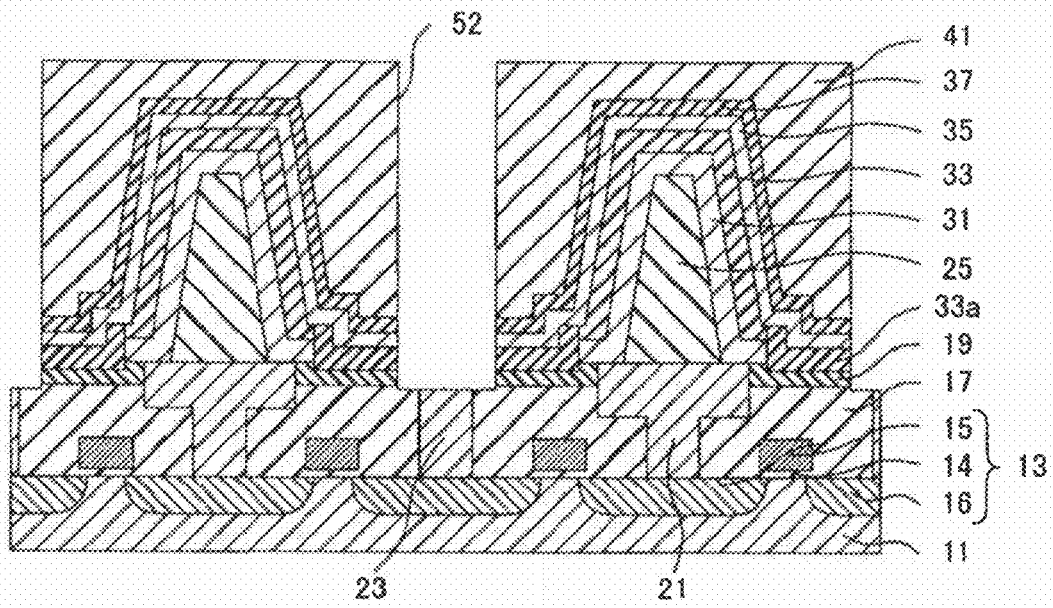
FIG. 9A is a cross-sectional view showing the method of manufacturing the semiconductor device according to Embodiment 1 of the present invention.
Figure 9B:
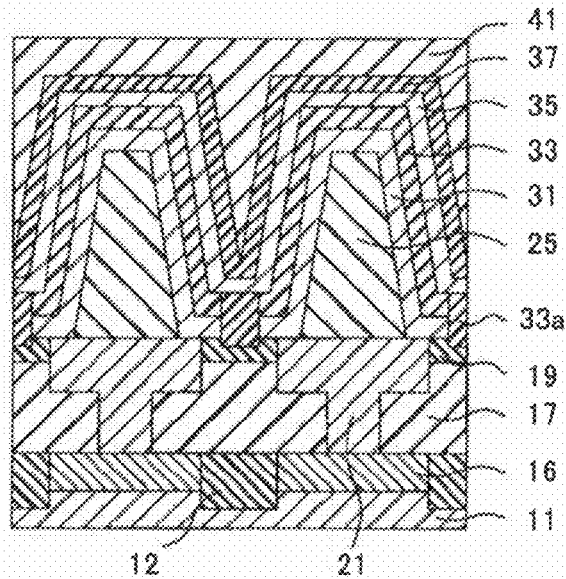
FIG. 9B is a cross-sectional view showing the method of manufacturing the semiconductor device according to Embodiment 1 of the present invention.

As shown in FIGS. 9A and 9B, the interlayer insulating film 41 formed of a silicon oxide film is deposited on the protective insulating film 37 by using, for example, the plasma CVD method. The protective insulating film 37 can prevent deposition process of the interlayer insulating film 41 from damaging the upper electrode 35 and the ferroelectric film 33. Thereafter, the interlayer insulating film 41 is planarized by the CMP method or the like, and is then patterned by using the photolithography processes. Using the patterned interlayer insulating film 41 as a mask, the upper electrode 35, the ferroelectric film 33, and the lower electrode 31, and further the protective insulating film 19 are etched by, for example, the high temperature RIE method at 300° C. or more. Thereby, a groove 52 being a first groove is formed, which extends in a direction along the B-B line and reach the top faces of the contact plugs 23. Faces of the interlayer insulating film 41 forming the groove 52 have inclination closer to 90° than the side faces of the insulating film columnar bodies 25, for example, about 87°.

Figure 10A:
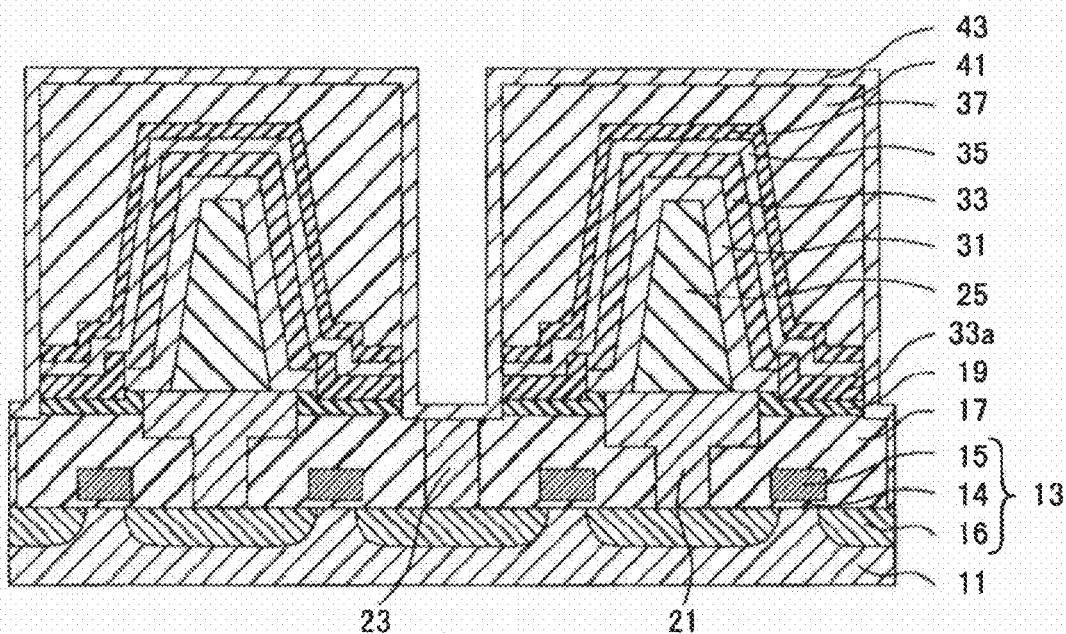
FIG. 10A is a cross-sectional view showing the method of manufacturing the semiconductor device according to Embodiment 1 of the present invention.
Figure 10B:
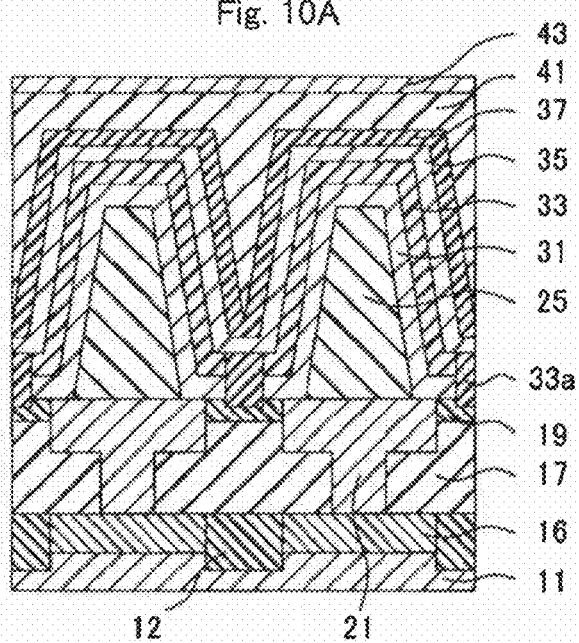
FIG. 10B is a cross-sectional view showing the method of manufacturing the semiconductor device according to Embodiment 1 of the present invention.

As shown in FIGS. 10A and 10B, the conducting film 43 formed of TiN is deposited on surfaces of the interlayer insulating film 41 and the groove 52 reaching the top faces of the contact plugs 23, by using the CVD method or the sputtering method. The conducting film 43 electrically connects the contact plugs 23 to the upper electrode 35 exposed to the surface of the groove 52.

Figure 11A:
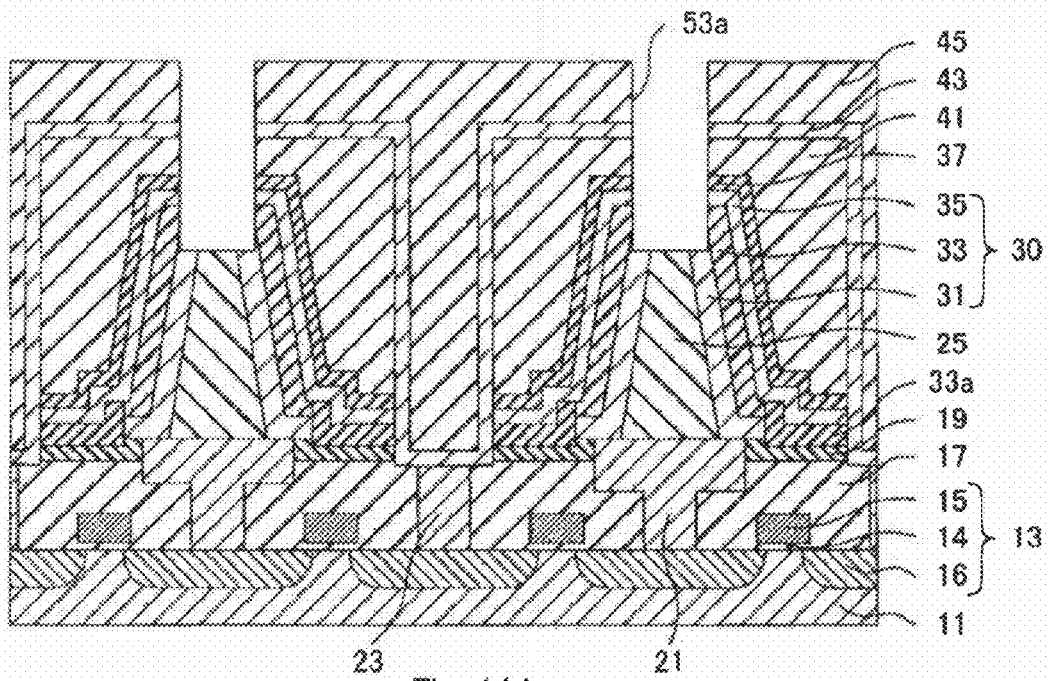
FIG. 11A is a cross-sectional view showing the method of manufacturing the semiconductor device according to Embodiment 1 of the present invention.
Figure 11B:
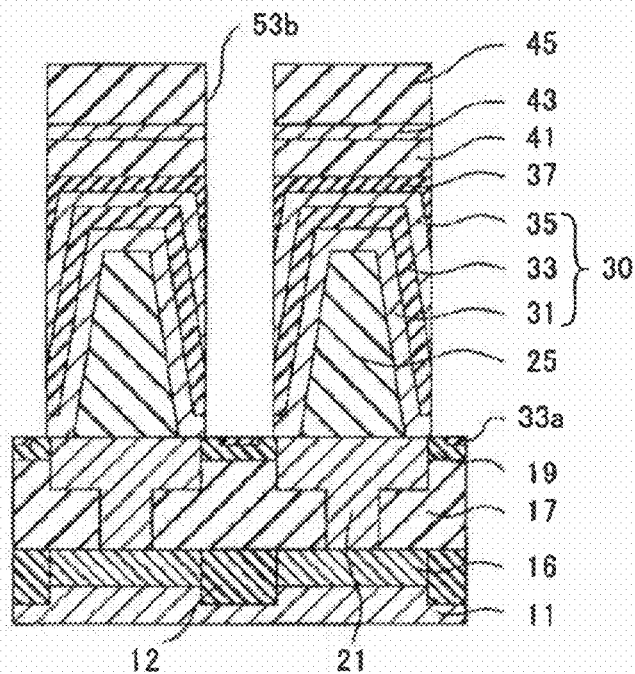
FIG. 11B is a cross-sectional view showing the method of manufacturing the semiconductor device according to Embodiment 1 of the present invention.

As shown in FIGS. 11A and 11B, the interlayer insulating film 45 being a third insulating film and being formed of a silicon oxide film is deposited on the conducting film 43 by using, for example, the plasma CVD method. Subsequently, the interlayer insulating film 45 is planarized by the CMP method or the like, and is then patterned by using the photolithography processes. Using the patterned interlayer insulating film 45 as a mask, the conducting film 43, and further, the interlayer insulating film 41 and the protective insulating film 37 are etched sequentially by the RIE method. Furthermore, the upper electrode 35, the ferroelectric film 33, and the lower electrode 31 are etched by the high temperature RIE method.

As shown in FIG. 11A, grooves 53a being second grooves are formed, which extend in a direction along the B-B line (see FIG. 1) and reach the top faces and side faces of the insulating film columnar bodies 25. Each of these grooves 53a divides a corresponding one of the ferroelectric capacitors 30, each formed of the upper electrode 35, the ferroelectric film 33, and the lower electrode 31, to right and left halves as shown in the diagram. Moreover, as shown in FIG. 11B, a groove 53b being a third groove is formed, which extend in a direction along the A-A line (see FIG. 1A), along the center line between adjacent ones of the contact plugs 21. The groove 53b divides the upper electrode 35, the ferroelectric film 33, and the lower electrode 31 to create right and left blocks of those as seen in FIG. 11B. The protective insulating film 19 and the like are exposed under the groove 53b extending in the direction along the A-A line.

Then, as shown in FIGS. 1B and 1C, the protective insulating film 47 being a fourth insulating film and being formed of an aluminum oxide film or the like is deposited on the interlayer insulating film 45 and the grooves 53a and 53b formed in the previous step, by using, for example, the sputtering method. Although not illustrated, the semiconductor device 1 then undergoes known manufacturing processes such as formation of an interlayer insulating film covering the protective insulating film 47, an interconnection layer, and the like. Thereby, the semiconductor device 1 is completed.

As shown in FIG. 1B, the lower electrode 31 of one ferroelectric capacitor 30 is connected to the lower electrode 31 of an adjacent ferroelectric capacitor 30 via a corresponding one of the contact plugs 21. In addition, the upper electrode 35 of the one ferroelectric capacitor 30 is connected to the upper electrode 35 of the other adjacent ferroelectric capacitor 30 via the conducting film 43. Adjacent ones of the ferroelectric capacitors 30 connected in a chained manner have a mirror symmetrical relationship, in which the mirror surface is vertical to the direction of the A-A line (connection direction).

As described above, the ferroelectric capacitors 30 are formed by: depositing the lower electrode 31 on the inclined side faces (for example, inclined by an inclination angle greater than 0° and less than 90° and preferably about 75° to 86°) of the insulating film columnar bodies 25; patterning the lower electrode 31; removing the mask film under the RIE conditions having a high selection ratio; and then sequentially depositing the ferroelectric film 33 and the upper electrode 35. The lower electrode 31 under the ferroelectric film 33 is etched with small etching damage, and the upper electrode 35 is deposited on the ferroelectric film 33 serially. For that reason, the lower electric film 31 and the upper electrode 35 receive very small damage at their interfaces with the ferroelectric film 33, compared to a case where the upper and lower electrodes are processed by dry etching or the like. As a result, the semiconductor device 1, the capacitor characteristics of which are prevented from deterioration, can be obtained.

Moreover, the ferroelectric capacitors 30 have a vertical structure in which the lower electrode 31, the ferroelectric film 33, and the upper electrode 35 are inclined to the surface of the semiconductor substrate 11 by an inclination angle greater than 0° and less than 90° and preferably about 75° to 86°. Accordingly, sufficient capacitor areas can be secured with the vertically extending ferroelectric capacitors 30 having small widths. Thereby, size reduction as well as prevention of signal amount reduction can be accomplished.

In addition, the ferroelectric film 33 and the ferroelectric film 33a are covered with any of the lower electrode 31, the upper electrode 35, the protective insulating films 19, 47, and the conducting film 43. Moreover, the ferroelectric capacitors 30 are covered with one or more of the protective insulating films 37, 47, and the conducting film 43. This prevents Pb from diffusing and escaping from the ferroelectric film 33 and the ferroelectric film 33a, and, in reverse, prevents reductive hydrogen or the like from diffusing into the ferroelectric film 33. Since the characteristics of the ferroelectric capacitors 30 are less deteriorated, the semiconductor device 1 can maintain high characteristics.

Embodiment 2

Figure 12A:
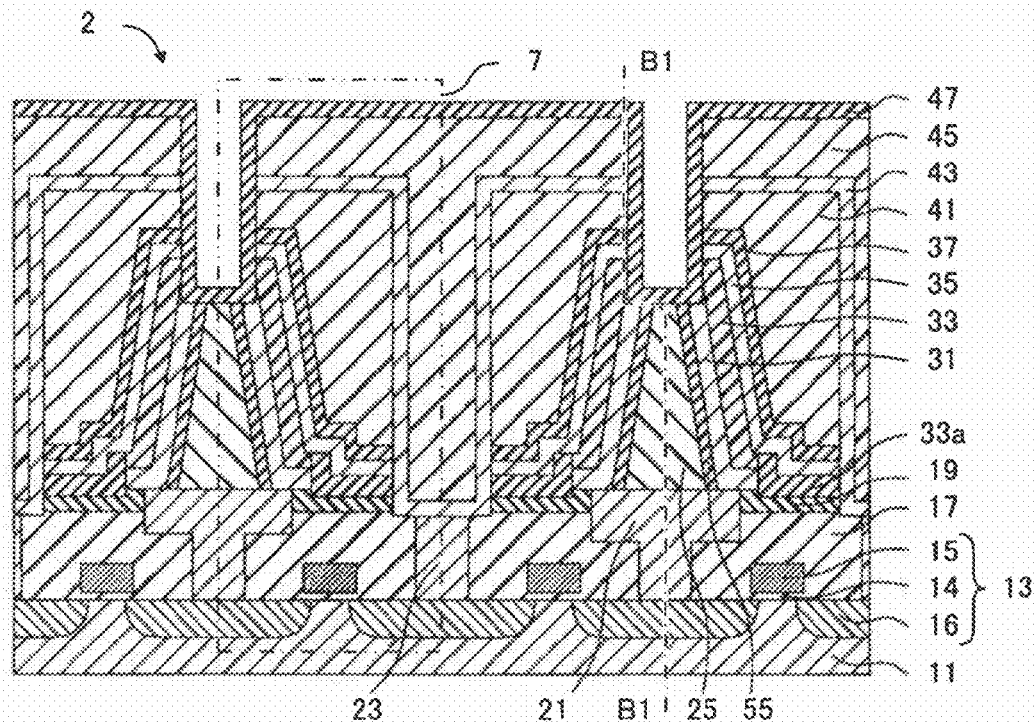
FIG. 12A is a cross-sectional view taken along a line corresponding to the A-A line in FIG. 1A, showing the structure of a semiconductor device according to Embodiment 2 of the present invention.
Figure 12B:
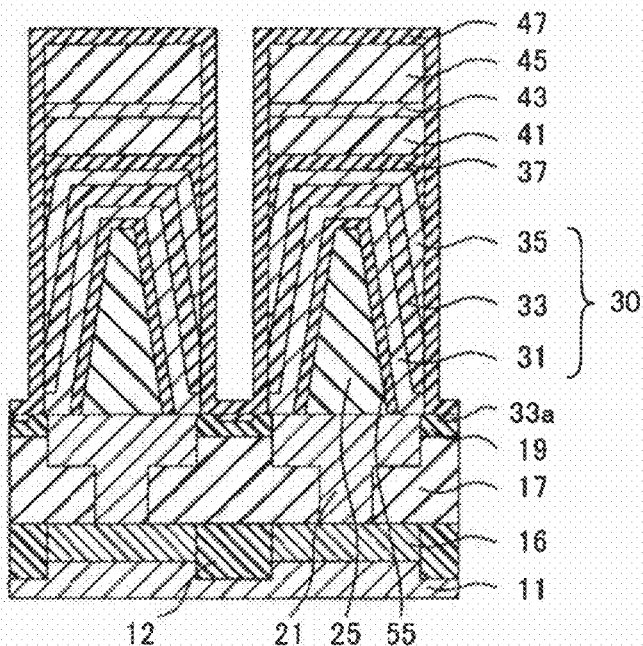
FIG. 12B is a cross-sectional view taken along the bent B1-B1 line in FIG. 12A.

With reference to FIGS. 12A and 12B, a description will be given of a semiconductor device and a method of manufacturing the semiconductor device, according to Embodiment 2 of the present invention. FIGS. 12A and 12B are cross-sectional views showing the structure of the semiconductor device. Specifically, FIG. 12A is a cross-sectional view taken along a line corresponding to the A-A line in FIG. 1A, and FIG. 12B is a cross-sectional view taken along the bent B1-B1 line in FIG. 12A, which corresponds to FIG. 1C. One difference from the semiconductor device 1 of Embodiment 1 is the addition of a protective insulating film formed on the top faces and sides of the insulating film columnar bodies. Note that the same components as Embodiment 1 bear the same reference numerals as used in Embodiment 1, and their description will be omitted.

As shown in FIGS. 12A and 12B, in a semiconductor device 2, a protective insulating film 55 formed of, for example, an aluminum oxide film is formed on the side faces and top faces of the insulating film columnar bodies 25. The lower electrode 31 formed of, for example, Ir is deposited on the protective insulating film 55. Except for the structure in which the protective insulating film 55 is interposed between the insulating film columnar bodies 25 and the lower electrode 31, the semiconductor device 2 has the same structure as the semiconductor device 1 of Embodiment 1. Alternatively, the protective insulating film 55 can be formed of a Ti film, a TixAly film, a TiAlxNy film, or the like to improve adhesion.

In the method of manufacturing the semiconductor device 2, the insulating film columnar bodies 25 are formed by the same steps as the semiconductor device 1 of Embodiment 1. Thereafter, the protective insulating film 55 is deposited on the top faces and side faces of the insulating film columnar bodies 25, on the protective insulating film 19, and on the peripheral parts of the contact plugs 21. Then, the protective insulating film 55 is partially removed, leaving the parts of the protective insulating film on the top faces and side faces of the insulating film columnar bodies 25. The following steps are similar to those for the semiconductor device 1 of Embodiment 1.

In the semiconductor device 2, the protective insulating film 55 is formed between the insulating film columnar bodies 25 and the lower electrode 31. Thereby, the adhesion between the insulating film columnar bodies 25 and the lower electrode 31 can be improved. Moreover, the protective insulating film 55 can prevent Pb in the PZT film of the ferroelectric film 33 from diffusing into the silicon oxide film of the insulating film columnar bodies 25. If Pb diffuses into the insulating film columnar bodies 25, $SiO_2$ of the insulating film columnar bodies 25 alters its quality to a lead glass. This is likely to cause drastic increase in the thermal expansion coefficient, drastic decrease of the softening point, or the like. Additionally, the semiconductor device 2 has similar effects to those brought about by the semiconductor device 1 of Embodiment 1.

Embodiment 3

Figure 13A:
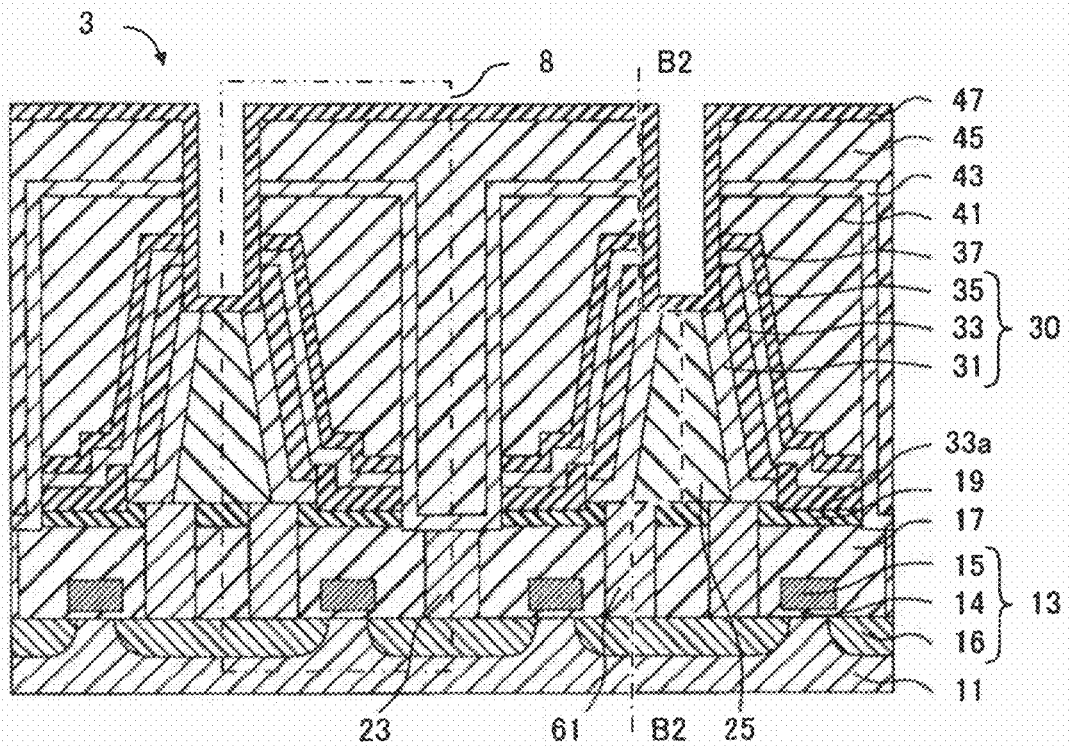
FIG. 13A is a cross-sectional view taken along a line corresponding to the A-A line in FIG. 1A showing the structure of a semiconductor device according to Embodiment 3 of the present invention.
Figure 13B:
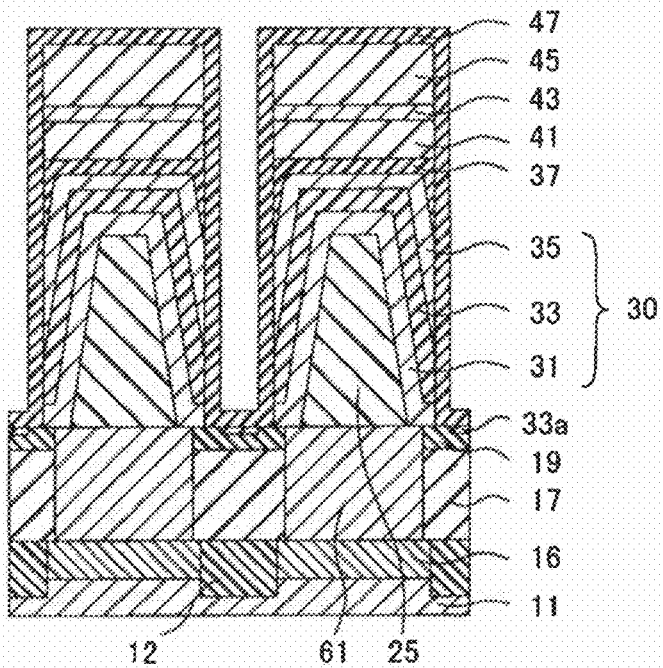
FIG. 13B is a cross-sectional view taken along the bent B2-B2 line in FIG. 13A.

With reference to FIGS. 13A and 13B, a description will be given of a semiconductor device and a method of manufacturing the semiconductor device, according to Embodiment 3 of the present invention. FIGS. 13A and 13B are cross-sectional views showing the structure of the semiconductor device. Specifically, FIG. 13A is a cross-sectional view taken along a line corresponding to the A-A line in FIG. 1A, and FIG. 13B is a cross-sectional view taken along the bent B2-B2 line in FIG. 13A, which corresponds to FIG. 1C. A difference from the semiconductor device 1 of Embodiment 1 is that contact plugs in contact with the lower electrode each have cross-sections with a rectangular solid shape. Note that the same components as Embodiment 1 bear the same reference numerals as used in Embodiment 1, and their description will be omitted.

As shown in FIGS. 13A and 13B, in a semiconductor device 3, two rectangular-solid contact plugs 61 are formed in parallel instead of a single contact plug 21 of Embodiment 1. The two parallel contact plugs 61 are connected to the diffusion layer 16 in common. The diffusion layer 16 to which the two contact plugs 61 are connected may have a wider width than the diffusion layer 16 of Embodiment 1. A part of the top surface of each of the contact plugs 61 is in contact with the bottom face of the corresponding insulating film columnar body 25, whereas the other part is in contact with the lower electrode 31. A contact area between the contact plugs 61 and the lower electrode 31 is, for example, almost equal to that between a single contact plug 21 and the lower electrode 31 in Embodiment 1. A distance between the parallel contact plugs 61 can be set to a smallest dimension possible in the manufacturing processes. The interlayer insulating film 17 and then the protective insulating film 19 are formed between the parallel contact plugs 61.

In the method of manufacturing the semiconductor device 3, contact holes for the parallel contact plugs 61 can be opened simultaneously with a single photolithography process. Thereafter, the contact plugs 61 are formed of any of TiN, TiAlxNy (x=1-99, y=99-1), and Ti/TiN/W, and are embedded in the contact holes. The following steps are similar to those for the semiconductor device 1 of Embodiment 1. While the contact holes for the contact plugs 21 require two opening formation processes in Embodiment 1, the contact plugs 61 of the present embodiment require only one opening formation process, allowing reduction in the number of steps.

In the semiconductor device 3, each of memory cells 8 has its own contact plug 61. The semiconductor device 3 has similar effects to those brought about by the semiconductor device 1 of Embodiment 1.

The present invention is not limited to the embodiments described above, and can be carried out as various modifications without departing from the spirit and scope of the present invention.

For example, examples described in the above embodiments take a case of using the vertical ferroelectric capacitors in a chain FeRAM. However, those capacitors are also applicable to other types of FeRAM, for example, a FeRAM in which ferroelectric capacitors and transistors are serially connected.

Moreover, examples described in the above embodiments take a case of using a PZT film as the ferroelectric film. However, other layered oxide ferroelectrics having a perovskite crystal structure, for example, PZLT ((Pb,La)(Zr,Ti)$O_3$) or SBT (SrBi$_2$Ta$_2$O$_9$) can also be used as the ferroelectric film.

While the invention includes various possible modifications and alternative forms, specific embodiments thereof are shown by way of embodiments in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims. It is therefore to be understood that within the scope for the appended claims, the invention may be practiced otherwise than as specifically described herein.

The invention claimed is:

1. A semiconductor device comprising:
    a semiconductor substrate;
    a plurality of transistors connected in series, a first transistor in the plurality of transistors having a first diffusion region and a second diffusion region arranged in the semiconductor substrate;
    an insulating film columnar body arranged above the semiconductor substrate and having a first side which is inclined to a top surface of the substrate by a first inclination angle that is greater than 0 degrees and less than 90 degrees; and
    a first memory cell including
        a first electrode arranged on the first side of the insulating film columnar body and connected to the first diffusion region via a first contact plug,
        a first ferroelectric film arranged on the first electrode and inclined to the top surface of the substrate by the first inclination angle, and
        a second electrode arranged on the first ferroelectric film, connected to the second diffusion region via a second contact plug, and inclined to the top surface of the substrate by the first inclination angle.

2. The semiconductor device according to claim 1, wherein the insulating film columnar body has a prismoid shape.

3. The semiconductor device according to claim 1, wherein the insulating film columnar body is arranged on the first contact plug.

4. The semiconductor device according to claim 1, wherein the insulating film columnar body has a second side which is inclined to the top surface of the substrate by a second inclination angle that is greater than 0 degrees and less than 90 degrees, and the semiconductor device further comprising:
    a second transistor in the plurality of transistors and including a third diffusion region and the first diffusion region; and
    a second memory cell including
        a third electrode arranged on the second side of the insulating film columnar body and connected to the first diffusion region via the first contact plug,
        a second ferroelectric film arranged on the third electrode and inclined to the top surface of the substrate by the second inclination angle, and
        a fourth electrode arranged on the second ferroelectric film, connected to the third diffusion region via a third contact plug, and inclined to the top surface of the substrate by the second inclination angle.

5. The semiconductor device according to claim 4, wherein:
    the first contact plug includes a first contact portion connected to the first diffusion region and a second contact portion connected to the first diffusion region;
    the first contact portion is connected to the first electrode; and
    the second contact portion is connected to the third electrode.

6. The semiconductor device according to claim 4, wherein the first memory cell is symmetrical to the second memory with respect to a center line of the insulating film columnar body.

7. The semiconductor device according to claim 1, wherein a cross-section of the first contact plug has a T shape.

8. The semiconductor device according to claim 1, further comprising:
    a protective insulating film arranged between the first side of the insulating film columnar body and the first electrode.

9. The semiconductor device according to claim 4, wherein the first inclination angle or the second inclination angle is greater than or equal to 75 degrees and less than or equal to 86 degrees.

10. The semiconductor device according to claim 1, wherein the insulating film columnar body is arranged over the first diffusion region.

* * * * *